US 6,600,608 B1

(12) United States Patent
Shafer et al.

(10) Patent No.: US 6,600,608 B1
(45) Date of Patent: Jul. 29, 2003

(54) CATADIOPTRIC OBJECTIVE COMPRISING TWO INTERMEDIATE IMAGES

(75) Inventors: David R. Shafer, Fairfield, CT (US); Alois Herkommer, Aalen (DE); Karl-Heinz Schuster, Königsbronn (DE); Gerd Fürter, Ellwangen (DE); Rudolf von Bünau, Essingen (DE); Wilhelm Ulrich, Dewangen (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/434,702

(22) Filed: Nov. 5, 1999

(51) Int. Cl.[7] ............................................... G02B 17/00
(52) U.S. Cl. ....................................... 359/729; 359/728
(58) Field of Search ...................... 359/731, 726–729

(56) References Cited

U.S. PATENT DOCUMENTS 5,004,331 A     4/1991  Haseltine et al.
5,488,229 A     1/1996  Elliott et al.
5,636,066 A     6/1997  Takahashi
5,717,518 A     2/1998  Shafer et al.
5,739,964 A  *  4/1998  Allen ........................... 359/727
5,861,997 A  *  1/1999  Takahashi .................... 359/727
6,212,334 B1 *  4/2001  Weigel et al. ............... 359/434

FOREIGN PATENT DOCUMENTS

DE    196 39 586 A1    9/1996
EP     0 737 878 A2   10/1996
JP        9312254      2/1997
WO    WO 01/59502 A1   8/2001

* cited by examiner

Primary Examiner—Scott J. Sugarman

(57) ABSTRACT

An objective comprising axial symmetry, at least one curved mirror and at least one lens and two intermediate images. The objective includes two refractive partial objectives and one catadioptric partial objective. The objective includes a first partial objective, a first intermediate a image, a second partial objective, a second intermediate image, and a third partial objective. At least one of the partial objectives is purely refractive. One of the partial objectives is purely refractive and one is purely catoptric.

64 Claims, 4 Drawing Sheets

CATADIOPTRIC OBJECTIVE COMPRISING TWO INTERMEDIATE IMAGES

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention is related to a catadioptric objective comprising two intermediate images.

TECHNICAL FIELD

Such is known from U.S. Pat. No. 4,701,035 to Hirose as a microlithographic projection exposure system. The objective shown there in FIG. 12 comprises two catoptric partial objectives and one catadioptric partial objective. All objectives are off-axis, not axially symmetric, purely spherical systems.

Catadioptric objectives with one intermediate image and a refractive partial objective are known as microlithographic projection systems with axial symmetry and central 09/263, 788) to Schuster, the latter being assigned to the assignee of this invention, and incorporated herein by reference.

Elliott and Shafer show the intermediate image near to the central opening of one of the mirrors, and lenses are arranged in the light path between the mirrors forming Mangin mirrors. All their optical surfaces are spherical.

Schuster shows only the mirrors to be aspherical and avoids big lenses in the beam path between them.

U.S. Pat. No. 5,004,331 to Haseltine et al. discloses a catadioptric projector for projecting an image to a dome (of a flight simulator). The system comprises an external entrance pupil as means for receiving substantially collimated light, a refractive subsystem of rotationally symmetric, coaxial lenses forming a pupil image which is situated at the central opening of an aspheric concave mirror, which together with another concave mirror forms a reflective pupil relay system. Both mirrors are tilted with respect to the optical axis of the refractive subsystem. The whole system provides a wide field of view image on a spherical dome. Full visible spectrum colour correction is obtained by combination of different glass.

SUMMARY OF THE INVENTION

It is an object of the invention to provide new design alternatives which allow for high resolution objectives with reduced lens diameters and high performance. Advantageously these designs are to be used in the VUV spectral region for microscopy or microlithography.

The solution of this problem is obtained by an objective comprising axial symmetry, at least one curved mirror and at least one lens and two intermediate images. The objective includes two refractive partial objectives and one catadioptric partial objective. The objective includes a first partial objective, a first intermediate image, a second partial objective, a second intermediate image, and a third partial objective. At least one of said partial objectives is purely refractive. One of the partial objectives is purely refractive and one is purely catoptric.

Axial symmetry together with two intermediate images, two refractive and one catadioptric partial objectives, two intermediate images and at least one refractive partial objective are varied descriptions of the novel aspects of the invention.

Another aspect that clearly groups the mirrors in one catoptric partial objective, which cooperates with one or more purely refractive partial objectives. In this case it is provided that the catoptric partial objective carries the burden of Petzval sum reduction or field flattening. This relieves the refractive partial objective from the need for beam contractions and expansions by negative and positive lens groups, as is long established with microlithographic projection exposure lenses, see e. g. Glatzel E., ZEISS-Information 26 (1981), p. 8–13, U.S. Pat. No. 5,260,832 or U.S. Pat. No. 5,903,400. In consequence the refractive partial objective is simplified and the lens diameters are reduced. Especially for the proposed use in the VUV spectral region this gives great relief to the materials supply of suitable crystals or quartz glasses.

The preferred embodiments also are related to the cited Schuster or Elliott and Shafer designs with two coaxial central obscuration opposing convex mirrors, which allows for a very convenient axial symmetric construction of the objective. Such inter alia has advantages in mechanical rigidity and in compatibility with established stepper/scanner architectures adapted to refractive objectives.

As a central obscuration in principle has degenerating effects in imaging—though in many cases decidedly taken advantage of as in annular or quadrupole illumination or in pupil filtering and apodisation—the reduction of the obscuration by the central hole of the mirrors of this design is of importance.

A preferred way of reducing obscuration is achieved by placing the intermediate images in the vicinity of the mirrors.

In an alternative embodiment, lenses are inserted between the mirrors. As negative lenses these cooperate with the mirrors to give single material colour correction, relieving the need for band narrowing the laser light source or for using an achromatizing material pair in the VUV.

The chief ray height at each of the mirror bores is approximately the same in value, but opposite in sign. This measure allows for minimal central obscuration.

The sequence where the mirror-containing partial objective is framed by the two refractive partial objectives is preferred as it allows for both intermediate image "planes" connected by the mirror containing partial objective to be curved such as to best exploit the specific correction capabilities of this partial objective.

While it is rather conventional that mirrors are aspheric also in the related art, in the present invention it is specifically stated that aspheric lens surfaces prove advantageous with this design. All advantages and restrictions as recently established for refractive projection exposure objectives, see e. g. patent application DE 199 22 209 of Schuster and references cited therein, as incorporated herein by reference, hold also for the use of aspheric surfaces in the designs of this invention.

Diffractive surfaces, as occasionally also proposed for projection exposure objectives, are also useful with this invention just as they are with refractive designs.

BRIEF DESCRIPTION OF THE DRAWINGS

The invention is described in more detail based on the examples shown in the drawings.

DETAILED DESCRIPTION OF THE INVENTION

Figure 1:
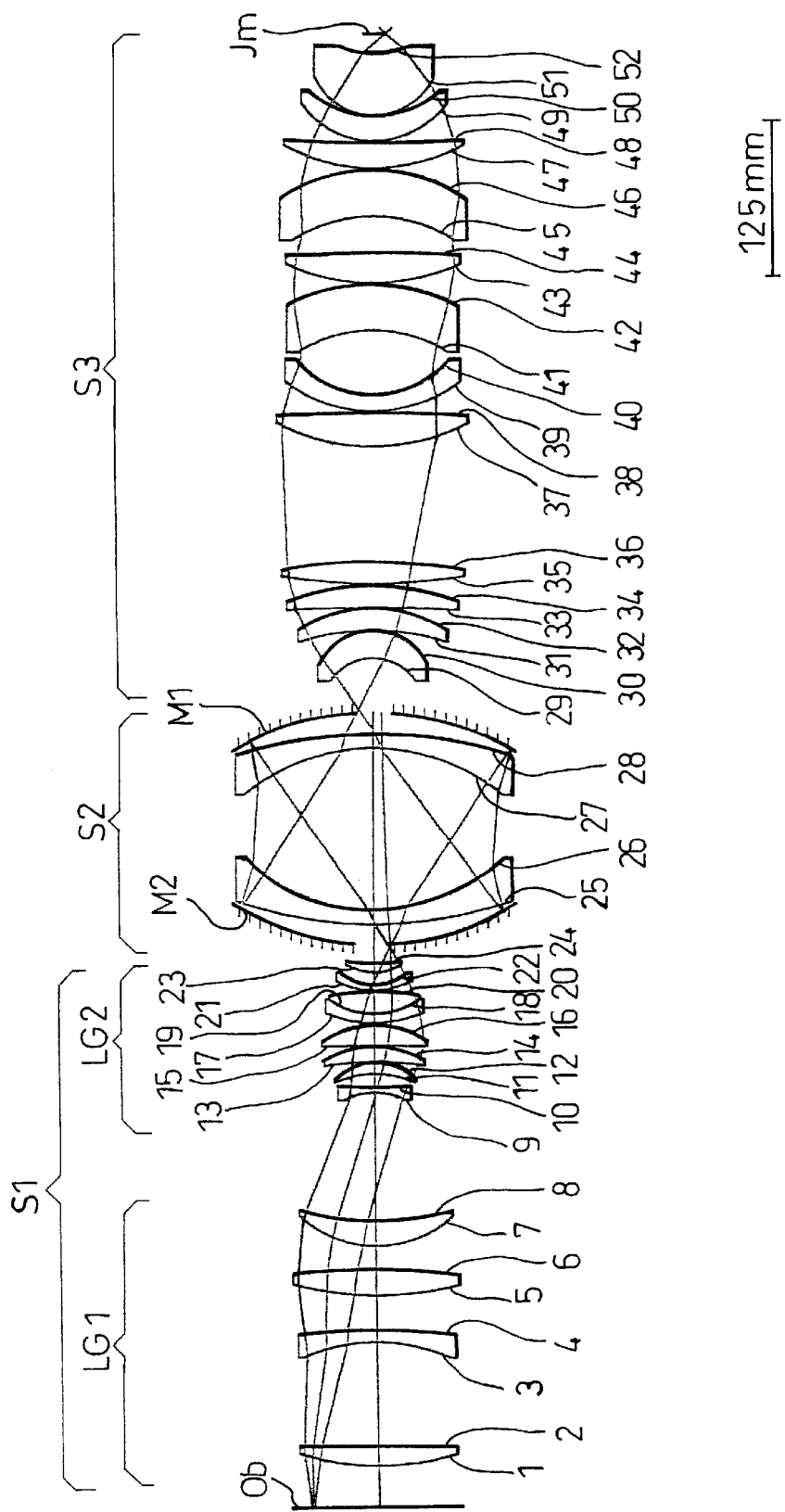
FIG. 1 shows the lens section of an example of an objective with a refractive, a catadioptric, a second refractive partial objective in sequence, reduction ratio 1:6.

The example of FIG. 1 is a 6:1 reduction objective for a scanner projection exposure apparatus of microlithography, with an image field diameter of 18.4 mm, an image side NA=0.75, being telecentric in the object space and the image space.

All lenses are made of fluorite $CaF_2$ and the system is adapted for illumination by the $F_2$ excimer-laser at 157 nm.

Certainly modifications for other wavelengths with other materials are possible, e. g. 193 nm and quartz glass.

The first partial objective S1 is refractive and has a reduction ratio of –1/4,27.

It shows two distinct lens groups LG1 of four relatively big lenses of about 130 mm diameter, and after the aperture plane a second lens group LG2 with significantly reduced diameter of about 80 mm and less. Here, the only aspheric lens surface is provided on surface 9 immediately subsequent to the aperture plane. Subsequent to the first intermediate image IMI 1, the second partial objective S2 is catadioptric with two opposite concave aspheric mirrors M1, M2 with central holes and two negative meniscus lenses 25, 26 and 27, 28 arranged between them. They are passed by the light beams three times. Its magnification ratio is –1/0, 99.

Such a magnification ratio near unity allows for a highly symmetric construction and optimal correction of distortions.

This arrangement is particularly suitable for chromatic correction and correction of field curvature, too. Therefore even with only one lens material $CaF_2$ a relatively wide laser bandwith of +–1.2 pm of an unnarrowed F2-laser is accepted by this objective.

Subsequent to the second intermediate image IM12 the third partial objective S3 again is refractive.

It takes up the divergent light beam with a strongly bent meniscus 29,30. A positive air lens—i. e. an air space in the form of a positive lens—between the lens surfaces 40 and 41 is characteristic.

With its reduction ratio of –1/1,42 the overall reduction ratio of the system is reached.

The detailed data of Table 1 show that the objective is composed of relatively few elements of limited diameters which helps for practical feasibility, as $CaF_2$ is very expensive and of limited availability. Also the light path in CaF2 is limited, thus reducing the problem of significant absorption at 157 nm.

The central obscuration necessitated by the fully coaxial construction of the catadioptric second partial objective S2 is a certain drawback, as such in principle deteriorates the modulation transfer function of an objective.

However, even in common refractive projection exposure objectives a small but distinct central obscuration is entered to accomodate beam paths of alignment systems etc.

Efforts are taken in the design to keep the central obscuration small, even with mirror diameters of practical size.

It was found that the diameter of the holes in the mirrors is minimized when the chief ray height is of equal value at the two holes, but opposite in sign.

Further the mirror holes are arranged next to the two intermediate images IMI 1 and IMI 2, where the beam diameters are at a minimum. Also the first partial objective S1 has substantial image reduction to keep this hole absolutely small, so that also the total mirror diameter is limited to a practical compact value.

The mirror holes are sized to be 2,0 mm larger in diameter than the closest ray at the edge of the field.

It is recommended that a obscuration mask is inserted at the pupil (aperture) plane of the second partial objective S2—just in front of lens surface 9. This should be sized 20,25% in diameter—equal to 4,1% in area. Then the area obscuration at the edge of the field has the same value as at the center and the MTF curves are completely uniform over the field.

The wavefront correction of this example is better than 0,011 waves rms over the field of $17\times7$ mm$^2$ and less than 0,009 waves rms over the field of $17\times6$ mm$^2$. The distortion is 2.4 ppm and the median shift is 10 nm.

Colour correction reaches CHL=34 nm/pm for longitudinal colour, so that a+–1.2 pm bandwidth of an unnarrowed F2-laser can be accepted.

Figure 2:
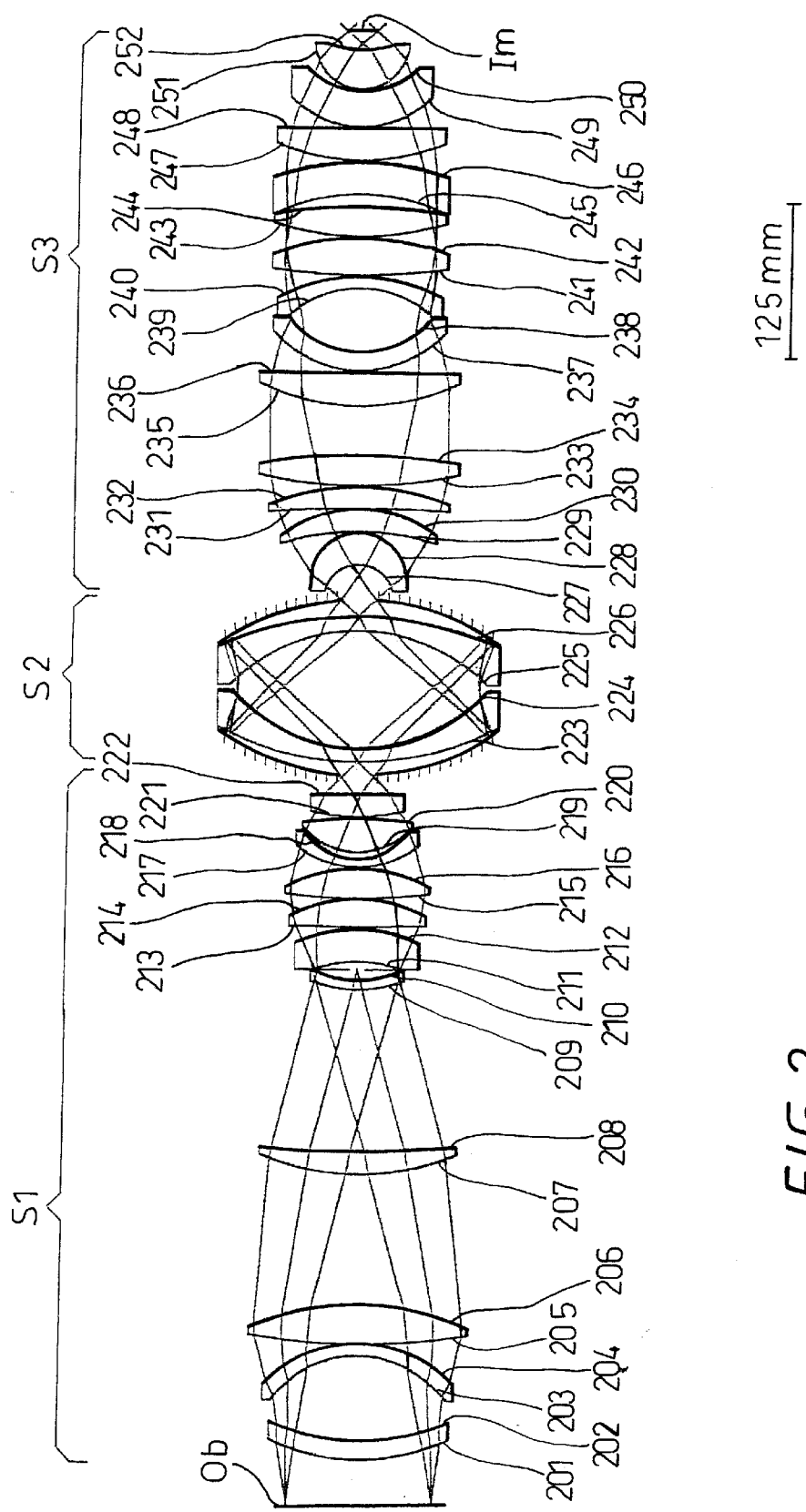
FIG. 2 shows another example of such an objective with reduction ratio 1:5.

The example of FIG. 2 and table 2 has an increased image field of $22\times9$ mm$^2$ as well as a significantly increased NA=0,75, while the reduction ratio is changed to 5:1. The system is of overall similarity with the first example, but with some significant deviations.

The first refractive partial objective S1 has its aperture plane enclosed by two menisci 209, 210 and 211, 212 which are concave towards the aperture plane. Here, an obscuring disk OD is inserted for the purpose of field-independent obscuration as described above.

Two lens surfaces 209 and 217 are aspheric, the first is next to the aperture plane to affect angle deviations and the second is more in the field region.

The imaging ratio of the first partial objective S1 is –1/4,67. Therefore the catadioptric partial objective can be so small.

The second partial objective S2 again is catadioptric with two aspheric mirrors M21, M22 and two negative meniscus lenses 223,224 and 225,226. Now their distance has strongly decreased, but angles increased in the beam path. This allows for very limited diameters of only 230 mm at the given large field and large NA. The reduction ratio is —1//0,97. In this embodiment, too, the central obscuration is 20% in diameter constant over the full field.

High NA of 0,7 at the intermediate images to allow for the small holes in the mirrors M21, M22 and a rather strong refractive power of the lenses 223,224 and 225,226 in between to give the required colour correction are specific to this example.

The mirrors M21, M22 are aspheric with maximum deviations from sphere being limited to 150 micrometers, which allows for good production and testing.

Also on the lenses between the mirrors aspheric surfaces could increase image quality. A third negative lens here would further optimize colour correction, if needed.

The third partial objective S3 shows the characteristic first meniscus lens 227,228 to be even more bent than in FIG. 1. This helps for coma correction. Also the second lens 229, 230 is a meniscus concave on the intermediate image IMI side, as the two final lenses 249,250 and 251,252 are menisci concave towards the image plane Im, what is preferred for aplanatism and correction of spherical aberration.

The positive air lens arranged between the lens surfaces 238 and 239 corrects the main part of spherical aberration. For this effect it is preferably arranged more in the pupil region of the objective than in a field region. However its arrangement before the pupil plane enables it to affect also the oblique spherical aberration in tangential and sagittal direction.

As a meniscus concave toward the pupil plane, lens 245,246 together with the air space created in front of it assists to the effects of the aforementioned air space.

The imaging ratio of this third partial objective S23 is −1/1,11 near unity. However, the arrangement is far from symmetry to the pupil plane, so that the strongly distorted intermediate image IMI can be transformed to a highly corrected image at the image plane Im.

Each partial objective has its part of the burden: S21 performs the reduction, S22 makes the colour and Petzval correction and S23 makes the fine tuning of imaging errors.

This second embodiment is not finely tuned to best error correction, but gives the principles of feasibility of such a design.

The aspheric surfaces of both examples of tables 1 and 2 are described by $$z = AS2 \times h^4 + AS3 \times h^6 + AS4 \times h^8 + AS5 \times h^{10} + AS6 \times h^{12} = AS7 \times h^{10}$$

with z=axial deviation from sphere, h=radial height from optical axis.

Figure 3:
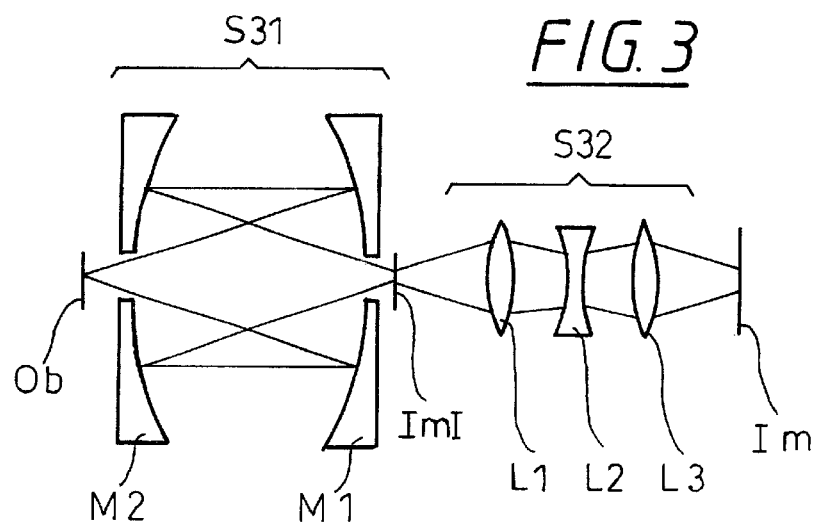
FIG. 3 shows a schematic lens arrangement of an objective with a purely catoptric partial objective of axial symmetry.

The example of FIG. 3 has a purely catoptric partial objective S31 and a purely refractive partial objective S32 between object Ob and image Im, with intermediate image IMI. This avoids the big negative lenses f the catadioptric partial objectives of the aforementioned examples. The mirrors M1, M2 now are purely used for Petzval correction—correction of field curvature.

The chromatic characteristics of the objective are defined by the refractive partial objective S32. Use of different lens materials allows for achromatization. For DUV/VUV excimer laser systems combinations of fluorides, namely calcium fluoride (fluorspar, fluorite), barium fluoride, strontium fluoride, NaF, Lif etc. and/or quartz glass, also in specifically doped versions, are adequate. Thus, for microlithography at 157 nm, positive lenses L1,L3 can be made of calcium fluoride and negative lens L2 can be made of barium fluoride or NaF, for example.

Naturally the refractive partial objective S32 has more lenses in a realistic microlithography or microscope objective and the lenses L1 to L3 shown are only schematic representatives.

As the refractive partial objective S32 of this catadioptric objective as compared to a full refractive system is relieved from the burden of Petzval correction, it can be simplified. The waist and bulge configuration with two and more waists of state-of-the-art refractive microlithographic reduction projection objectives is therefore not needed. Only one waist of minor beam reduction remains. Consequently the refractive partial objective S32 can be shorter, smaller in diameter and can have less lenses. Transmission and contrast are thus increased, while cost is decreased. Aspheric lens surfaces further help in this effect.

As the catoptric partial objective S31 is free of lenses, its diameter is not critical: Precision aspherical mirrors with diameters of more than one meter are state of the art in astronomy, for example.

Obviously the arrangement of catoptric and refractive partial objective also can be changed in sequence. Then the diameter of the catoptric partial system is reduced in consequence of the imaging ratio of the refractive partial objective.

Figure 4:
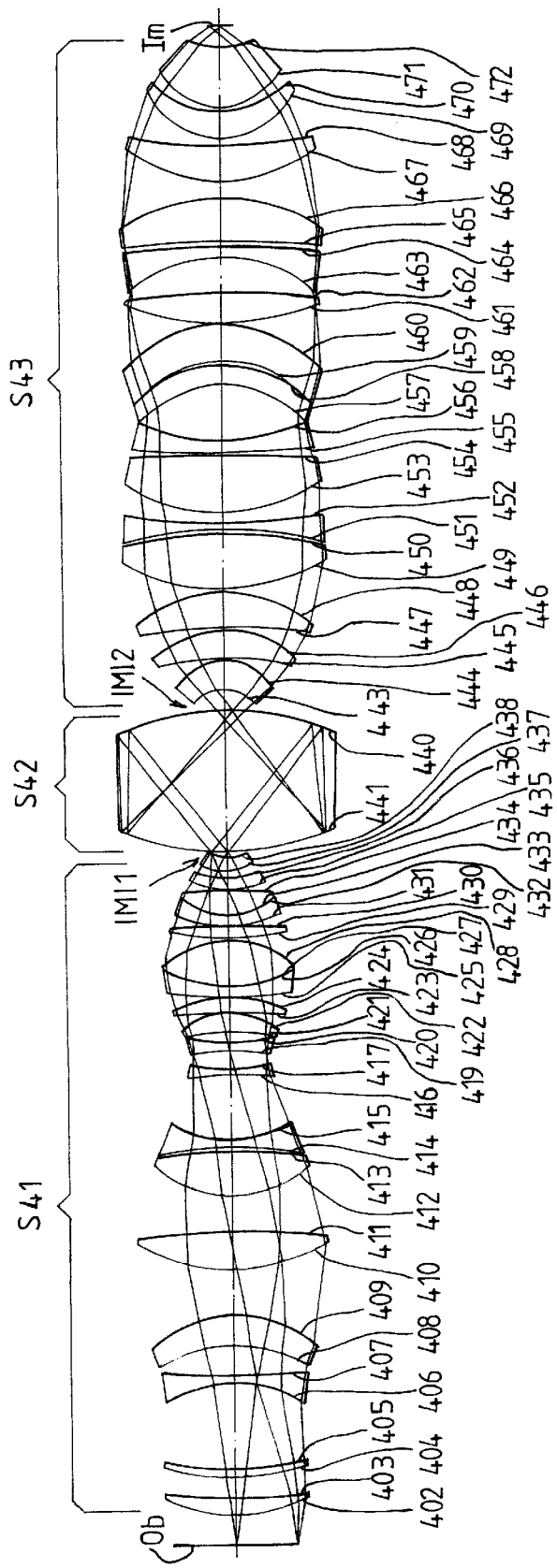
FIG. 4 shows another example of the invention with a refractive, a catoptric, a second refractive partial objective in sequence.

For reasons of good accessibility of object Ob and image Im and of more design space for correction, it is advantageous if this system also is extended to a first refractive partial objective S41, a catoptric partial objective S42 and a second refractive partial objective S43 with intermediate images IMI1 and IM12, as shown in the example of FIG. 4.

The advantages of the first two embodiments with minimal obscuration and of the third example without big lenses between the mirrors M1, M2 can thus be combined.

Table 3 gives the design data of this example. This is a 157 nm objective with all crystal lenses, most of LiF and some of NaF, giving excellent chromatic properties for an unnarrowed $F_2$ laser with 1,5 pm band width. Reduction ratio is 1:5, maximum image field height is 11,88 mm, NA=0,75. Maximum lens diameter is 190,5 mm, maximum mirror diameter is 201 mm. The overall length Ob-Im is 1,459 m.

The use of crystal lenses in DUV to VUV microlithographic objectives is made here in adaptation of the earlier application DE 199 29 701.0 dated Jun. 29, 1999 (99032 P) of co-inventor Schuster and the same assignee. This cited application as a whole shall be part of the disclosure of this application, too.

Consequently, negative NaF lenses are entered, plus one positive NaF meniscus 408, 409 in the first partial objective S41, which reduces lateral chromatic aberration, in an overall LiF lens system.

Aspheric surfaces are entered into this design at a number of surfaces, where this is advantageous. Consequently, also the mirrors 440 and 441 are aspheric.

In the first, reducing partial objective S41, the second bulge comprises one asphere, the second waist one asphere, and the third bulge 2 aspheres. In the third partial objective S43 the first bulge comprises one asphere, while the second of the two bulges comprises 2 aspheres.

The aspheric surfaces of the example of tab. 3 are described by $$P(h) = \frac{\delta * h^2}{1 + \sqrt{1 - (1 - EX) * \delta^2 * h^2}} + C_1 h^4 + \cdots + C_n h^{2n+2}$$

Where P is the height deviation as a function of the radius h (ray height with respect to the optical axis) with the aspheric constants $C_1$ to $C_6$ as given in table 3. $\delta$ is the inverse of the radius given in the table.

The objective has a high correction quality, as the wavefront error calculated for two lines of 1 pm spectral distance is less than 8 millilambda at the maximum field height and reduces to less than five millilambda on the optical axis.

The central obscuration of the system can be designed to need by enlarging distance and diameter of the mirrors 440, 441 of the catoptric partial objective S42.

Ring sector field imaging is conventional with many catoptric and catadioptric projection exposure systems of generally asymmetric construction. Such can also be realized within the invention. Then, the mirrors only need an off-axis ring sector opening for entering of the light beam, and consequently the pupil only has a two sector obscuration with further reduced effects compared to the circular central obscuration.

Figure 5:
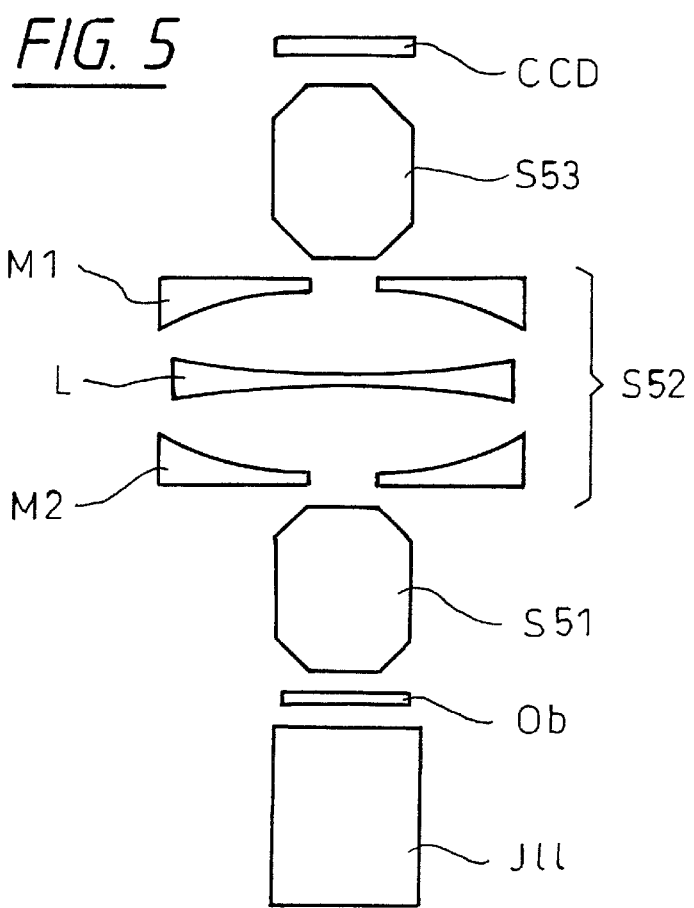
FIG. 5 shows schematically a microscope with an objective according to the invention.

FIG. 5 schematically shows a microscope with an objective according to the invention.

As such primarily makes sense for a DUV/VUV inspection microscope, direct visual observation by an ocular is not shown, but an image detector CCD of any appropriate known sort is provided in the image plane of the objective. The objective is constituted by two refractive partial objectives S51, S53 and the intermediate catoptric or catadioptric partial objective S52. The example shows two coaxial opposite mirrors M1, M2 and one negative lens L in it.

The design of the objective is generally as shown in the embodiments described above, but with image and object plane exchanged to obtain magnification, and with higher imaging ratio and smaller field.

An illumination system III illuminates the object Ob appropriately.

TABLE 1

0, 75 N.A., −2 = 157 nm, β = 6X, 17 × 7 mm double-telecentric

| Element | RADIUS [mm] | THICKNESS [mm] | APERTURE RADIUS [mm] |
|---|---|---|---|
| OB | — | 41.365 | |
| 1 | 207.804 | 15.0000 | 64 |
| 2 | 7154.0 | 85.7060 | |
| 3 | −148.152 | 10.000 | 60 |
| 4 | −480.523 | 27.979 | |
| 5 | 275.460 | 21.000 | 68 |
| 6 | −420.424 | 18.169 | |
| 7 | 91.68 | 20.000 | 62 |
| 8 | 231.534 | 102.963 | |
| 9 | −62.100 | 5.000 | 25 |
| 10 | 551.104 | 10.065 | |
| 11 | −77.910 | 9.000 | 32 |
| 12 | −47.566 | 1.000 | |
| 13 | −281.444 | 12.500 | 41 |
| 14 | −83.966 | 1.000 | |
| 15 | −1256.9 | 17.000 | 43 |
| 16 | −69.116 | 1.000 | |
| 17 | 99.668 | 7.000 | 40 |
| 18 | 60.790 | 0.978 | |
| 19 | 63.022 | 18.000 | 37 |
| 20 | −177.094 | 1.000 | |
| 21 | 65.632 | 5.000 | |
| 22 | 43.522 | 9.388 | |
| 23 | 44.597 | 7.000 | 23 |
| 24 | 115.690 | 20.474 | |
| IMI1 | — | −5.072 | |
| M 2 | 220.905 | 16.140 | 115 |
| 25 | 349.084 | 11.500 | 112 |
| 26 | 150.213 | 131.449 | |
| 27 | −163.770 | 11.500 | 105 |
| 28 | −381.158 | 17.158 | |
| M1 | −228.356 | | 115 |
| 29 | −42.092 | 21.059 | 35 |
| 30 | −51.728 | 1.000 | |
| 31 | −194.937 | 18.000 | 59 |
| 32 | −113.392 | 1.000 | |
| 33 | −1132.0 | 18.000 | 70 |
| 34 | −193.134 | 1.000 | |
| 35 | 458.425 | 18.000 | 74 |
| 36 | −386.456 | 93.349 | |
| 37 | 171.069 | 27.160 | 78 |
| 38 | −1302.6 | 1.000 | |
| 39 | 115.683 | 12.796 | 71 |
| 40 | 79.902 | 53.335 | |
| 41 | −108.436 | 37.180 | 61 |
| 42 | −140.231 | 1.000 | |
| 43 | 171.662 | 24.000 | 71 |
| 44 | −1877.0 | 29.921 | |
| 45 | −118.760 | 37.456 | 66 |
| 46 | −131.389 | 1.000 | |
| 47 | 153.982 | 21.000 | 73 |
| 48 | 1445,6 | 1.049 | |
| 49 | 72.396 | 20.001 | 59 |
| 50 | 76.113 | 1.000 | |

TABLE 1-continued 0, 75 N.A., −2 = 157 nm, β = 6X, 17 × 7 mm double-telecentric

| | | | |
|---|---|---|---|
| 51 | 53.654 | 49.996 | 49 |
| 52 | 69.967 | 16.341 | |
| LM | — | — | |

Aspheric Surface Data

9: ASO = 0   AS1 = 0   AS2 = −1.6880e-06
AS3 = 1.5172e-10
  AS4 = −1.1366e-12/AS5 = 1.3050e-16/AS6 = 1.7402e-18
AS7 = −2.4094e-21
M1: ASO = 0   AS1 = 0   AS2 = −2.1332e-09
AS3 = −1.157e-13
  AS4 = −2.4958e-18/AS5 = 2.735e-23/AS6 = −7.4436e-27
AS7 = 1.5059e-31
M2: ASO = 0   AS1 = 0   AS2 = 1.7841e-09
AS3 = 6.8616e-14
  AS4 = 3.6976e-18/AS5 = 5.2619e-23/AS6 = −2.331e-27
AS7 = 2.8845e-31
M1, M2 central hole r = 15,3 nm
Index of refraction CaF$_2$ at 157 nm: n = 1,55971

TABLE 2

5x, .75 N.A., 22 × 9 mm, λ = .157 μm

| Element | RADIUS [mm] | THICKNESS [mm] | APETURE RADIUS [mm] |
|---|---|---|---|
| OB | Telecentric | 34.000 | |
| 201 | 170.721 | 15.000 | 73 |
| 202 | 183.404 | 70.512 | |
| 203 | −88.583 | 10.000 | 72 |
| 204 | −109.418 | 0.097 | |
| 205 | 489.985 | 31.998 | 86 |
| 206 | −223.861 | 105.847 | |
| 207 | 211.214 | 18.000 | 80 |
| 208 | 1008.7 | 132.111 | |
| 209 | 98.261 | 7.000 | 38 |
| 210 | 75.231 | 9.337 | |
| OD | — | 6.429 | obscuring disk r = 6,75 mm |
| 211 | −105.403 | 28.061 | 35 |
| 212 | −103.952 | 1.000 | |
| 213 | 2546.4 | 21.782 | 56 |
| 214 | −129.850 | 1.000 | |
| 215 | 459.497 | 25.167 | 59 |
| 216 | −117.119 | 1.000 | |
| 217 | 76.297 | 7.000 | 50 |
| 218 | 52.636 | 5.014 | |
| 219 | 60.098 | 27.883 | 45 |
| 220 | −254.989 | 1.000 | |
| 221 | 158.480 | 18.301 | 38 |
| 222 | −1889.6 | 19.412 | |
| IMI | | −4.449 | |
| M2 | 198.917 | 11.198 | 115 |
| 223 | 249.698 | 11.500 | 115 |
| 224 | 141.621 | 95.251 | |
| 225 | −146.113 | 11.500 | 105 |
| 226 | −279.951 | 14.507 | |
| M1 | −195.876126 | | 115 |
| IMI2 | — | 27.988 | |
| 227 | −29.245 | 26.188 | 28 |
| 228 | −38.617 | 1.000 | |
| 229 | −212.943 | 16.904 | 64 |
| 230 | −108.498 | 1.000 | |
| 231 | −1195.7 | 19.000 | 74 |
| 232 | −186.309 | 1.000 | |
| 233 | 397.280 | 24.000 | 82 |
| 234 | −447.100 | 40.123 | |
| 235 | 184.325 | 28.000 | 82 |
| 236 | −5827.0 | 1.000 | |
| 237 | 94.479 | 15.000 | 71 |
| 238 | 73.235 | 52.490 | |

TABLE 2-continued

5×, .75 N.A., 22 × 9 mm, λ = .157 μm

| | | | |
|---|---|---|---|
| 239 | −84.776 | 10.000 | 58 |
| 240 | −134.685 | 0.997 | |
| 241 | 548.320 | 30.000 | 72 |
| 242 | −202.022 | 1.370 | |
| 243 | 244.314 | 24.000 | 71 |
| 244 | −390.876 | 9.997 | |
| 245 | −154.779 | 26.099 | 69 |
| 246 | −221.429 | 1.000 | |
| 247 | 170.308 | 27.000 | 69 |
| 248 | 5689.0 | 1.000 | |
| 249 | 82.493 | 29.706 | 58 |
| 250 | 66.456 | 1.000 | |
| 251 | 38.604 | 31.198 | 38 |
| 252 | 74.002 | 16.468 | |
| IM | — | — | 11.9 |

Aspheric Surface Data

Surface 209

ASO = 0    AS1 = 0    AS2 = −1.9059e-17
AS3 = 5.2904e-10/AS4 = −2.9602e-13/AS5 = 2.9727e-16
AS6 = −3.3981e-19/AS7 = 3.3504e-23

Surface 217

ASO = 0    AS1 = 0    AS2 = −2.7436e-07
AS3 = −1.1707e-12/AS4 = −1.1841e-14/AS5 = 1.8131e-17
AS6 = −7.5053e-21/AS7 = 1.3749e-24

Surface M1

ASO = 0    AS1 = 0    AS2 = 1.9405e-09
AS3 = 9.5605e-14/AS4 = −2.6910e-17/AS5 = 5.9514e-23
AS6 = −7.7031e-26/AS7 = 1.8364e-30

Surface M2

ASO = 0    AS1 = 0    AS2 = 3.2910e-09
AS3 = 1.4964e-13/AS4 = −1.2351e-17/AS5 = 2.4844e-21
AS6 = −1.9615e-25/AS7 = 6.7644e-30

M1, M2 central hole r = 15,5 mm

TABLE 3

| SURFACE | RADI I | THICKNESS | MATERIAL |
|---|---|---|---|
| Ob | | 31.542 | |
| 402 | 161.992 | 15.188 | LiF |
| 403 | 469.503 | 19.672 | |
| 404 | 231.249 | 8.649 | LiF |
| 405 | 323.701 | 81.163 | |
| 406 | −125.044 | 7.000 | LiF |
| 407 | 1233.917 | 29.038 | |
| 408 | −136.3150 | 28.504 | NaF |
| 409 | −110.661 | 42.406 | |
| 410 | 166.198 | 38.763 | LiF |
| 411 | −426.980 | 33.045 | |
| 412 | 102.987 | 42.894 | LiF |
| 413 | −497.639 | 3.533 | |
| 414 | −344.154 | 7.000 | NaF |
| 415 | 110.870 | 62.455 | |
| 416 | −313.200 | 7.000 | LiF |
| 417 | 306.167 | 12.322 | |
| AS1 | ∞ | 4.589 | |
| 419 | −294.9867 | 7.21 | NaF |
| 420 | 139.1333 | 10.42 | |
| 421 | −198.121 | 17.91 | LiF |
| 422 | −67.419 | .7642 | |
| 423 | −423.496 | 14.9924 | LiF |
| 424 | −117.918 | .8112 | |
| 425 | 743.808 | 8.0149 | NaF |
| 426 | 123.869 | .9171 | |
| 427 | 128.249 | 44.3083 | LiF |
| 428 | −90.153 | .8501 | |
| 429 | 230.303 | 11.2449 | LiF |
| 430 | 1688.121 | 1.1630 | |
| 431 | 122.245 | 7.9843 | NaF |
| 432 | 59.579 | .7500 | |
| 433 | 60.793 | 24.9206 | LiF |
| 434 | −934.252 | 1.1385 | |
| 435 | 87.724 | 10.9289 | LiF |
| 436 | 74.6528 | 7.4167 | |
| 437 | 43.171 | 13.3010 | LiF |
| 438 | 47.425 | 5.000 | |
| IMI1 | ∞ | 135.0601 | |
| 440 | −248.671 | −135.,0601 | |
| 441 | 243.629 | 135.2019 | |
| IMI2 | ∞ | 21.4887 | |
| 443 | −39.71329 | 27.9107 | LiF |
| 444 | −53.040 | 2.7851 | |
| 445 | −218.179 | 26.3722 | LiF |
| 446 | −100.461 | 2.5410 | |
| 447 | −444.958 | 33.4544 | LiF |
| 448 | −125.627 | 3.4864 | |
| 449 | 205.875 | 52.0553 | LiF |
| 450 | −445.534 | 3.1476 | |
| 451 | −393.14835 | 7.1061 | NaF |
| 452 | 529.85954 | 10.9028 | |
| 453 | 171.69804 | 54.8263 | LiF |
| 454 | −3285.94521 | 2.9859 | |
| 455 | 1249.94523 | 10.7714 | NaF |
| 456 | 188.56505 | 53.9985 | |
| 457 | −102.09026 | 18.5249 | LiF |
| 458 | −114.02167 | 3.1811 | |
| 459 | −108.06602 | 36.3405 | LiF |
| 460 | −122.25579 | .8148 | |
| 461 | 237.93896 | 30.4791 | |
| 462 | −591.44374 | 33.927 | |
| 463 | −131.73596 | 9.2936 | NaF |
| 464 | −816.022 | 4.0340 | |
| 465 | −921.759 | 43.70 | LiF |
| 466 | −161.952 | 12.96 | |
| 467 | 135.682 | 35.56 | LiF |
| 468 | 485.873 | 7.77 | |
| 469 | 74.486 | 26.357 | LiF |
| 470 | 88.618 | 3.623 | |
| 471 | 64.861 | 56.517 | LiF |
| 472 | 65.449 | 20.524 | |
| Im | ∞ | | |

Aspheric constants

| | | | | | | | |
|---|---|---|---|---|---|---|---|
| 11 A | C1 | .43635053E-07 | C2 | −.10565814E-11 | C3 | .33243511E-16 | |
| | C4 | −.27930883E-20 | C5 | .11432015E-24 | C6 | −.33257819E-29 | |
| 19 A | C1 | −.96601935E-06 | C2 | .70267826E-10 | C3 | .31115875E-13 | |
| | C4 | −.43329420E-17 | C5 | −.41852201E-20 | C6 | .30053413E-25 | |
| 25 A | C1 | −.29611487E-07 | C2 | .20760499E-10 | C3 | −.12518124E-14 | |
| | C4 | −.52770520E-18 | C5 | .86996061E-22 | C6 | −.19792693E-27 | |
| 34 A | C1 | −.15885997E-06 | C2 | .52924012E-10 | C3 | −.73552870E-14 | |
| | C4 | −.86379790E-18 | C5 | .59324551E-21 | C6 | −.39153227E-25 | |
| 40 A | C1 | .23060301E-07 | C2 | .81122530E-13 | C3 | −.32179819E-17 | |
| | C4 | .71766836E-21 | C5 | −.46055104E-26 | C6 | .12956188E-31 | |
| 41 A | C1 | −.11072232E-07 | C2 | .31369498E-13 | C3 | .77375306E-17 | |
| | C4 | .19892497E-21 | C5 | −.89740115E-26 | C6 | .68627541E-31 | |
| 49 A | C1 | .56699275E-08 | C2 | .57127904E-12 | C3 | .59227712E-16 | |
| | C4 | .21077816E-20 | C5 | .15595431E-24 | C6 | −.13690607E-29 | |
| 63 A | C1 | −.17174244E-07 | C2 | .18573484E-11 | C3 | −.42802250E-16 | |
| | C4 | .51394491E-20 | C5 | −.37650847E-24 | C6 | .22638360E-28 | |
| 68 A | C1 | .10650246E-07 | C2 | .20265609E-11 | C3 | −.88014450E-16 | |
| | C4 | .91073382E-20 | C5 | −.55181052E-24 | C6 | .37391374E-28 | |

What is claimed is:

1. An objective comprising axial symmetry, at least one curved mirror and at least one lens and two intermediate images.

2. An objective according to claim 1 comprising two refractive partial objectives and one catadioptric partial objective.

3. An objective according to claim 1 comprising
a first partial objective,
a first intermediate image,
a second partial objective, a second intermediate image,
a third partial objective,
wherein at least one of said partial objectives is purely refractive.

4. An objective according to claim 1 comprising at least
a first partial objective,
an intermediate image,
a second partial objective,
one of said partial objectives being purely refractive and one being purely catoptric.

5. An objective according to claim 1, flintier comprising a partial objective with two opposing concave mirrors with central bores, and with an optical axis, said concave mirrors being arranged axially symmetric with respect to said optical axis, their concave surfaces facing each other.

6. An objective according to 5, wherein each of said concave mirrors has a vertex situated on said optical axis, and wherein each of said intermediate images has a maximum image height and is given on a surface with a piercing point on said optical axis, and at least one of said vertici is distant from at least one of said piercing points by a distance less than the maximum image height of the image having said piercing point.

7. An objective according to claim 5, wherein at least one lens is arranged in the beam path between the two concave mirrors.

8. An objective according to claim 7, herein said at least one lens has negative refractive power.

9. An objective according to claim 5, wherein said concave mirrors have central openings with a radius, each of said radii being no greater than 1.5 times the maximum image height of the neighboring intermediate image.

10. An objective according to claim 5, wherein each of the radii of said central openings is less than 25% of the maximum light beam height at said concave mirror.

11. An objective according to claim 5, wherein the light beam has a chief ray height at each of the bores, which is of equal value but opposite sign at the two bores.

12. An objective according to claim 1, wherein a first refractive partial objective,
a partial objective comprising at least one mirror, and
a second refractive partial objective are arranged sequence.

13. An objective according to claim 1, wherein at least one lens of said refractive partial objectives has an aspheric surface.

14. An objective according to claim 1, wherein at least one of said partial objectives comprises a diffractive optical element.

15. An objective according to claim 1, wherein said partial objective comprising at least one mirror has a magnification ratio in the range between −1/0.7 and −1/1.3.

16. An objective according to claim 12, wherein the first refractive partial objective has a magnification ratio of −1/3 to −1/8.

17. An objective according to claim 12, wherein the second refractive partial objective has a magnification ratio of −1/0.8 to −1/2.

18. An objective according to claim 1, wherein at least one of the first and second refractive partial objectives consists of a first positive lens group, a negative lens group and a second positive lens group.

19. An objective according to claim 1, wherein said negative lens group comprises at least two negative menisci, their concave surfaces facing each other.

20. An objective according to claim 18, wherein at least one of said first and second positive lens groups comprises at least four positive lenses.

21. An objective according to claim 1, wherein all lenses contained are made of the same material, preferably a fluoride crystal.

22. An objective according to claim 4, wherein lenses are made from at least two different fluorides.

23. An objective according to claim 1, wherein the image field is an off-axis ring sector.

24. An objective according to claim 1, wherein the first partial objective has a pupil plane and a central obscuration device is located near said pupil plane.

25. An objective according to claim 1, wherein at least one of the refractive partial objectives has at least a first lens group and a second lens group, one of them having lesser lens diameters.

26. An objective according to claim 14, wherein the at least one aspherical lens surface is on a lens of the lens group with lesser lens diameters.

27. An objective according to claim 1, wherein the third partial objective has at least one positive concave air lens near its pupil plane, namely located at a distance from the second intermediate image of between 25% and 75% of the length of this partial objective.

28. An objective according to claim 1, wherein the image side partial objective has two first lenses subsequent to the second intermediate image, which are menisci concave on the side of the intermediate image, and two last lenses adjacent to the image, which are meniscus concave on the side of the image.

29. An objective according to claim 1, wherein the image side partial objective has a pupil plane and at least one lens arranged at a distance from the image plane of between 25% and 75% of the length of the image side partial objective is a meniscus concave toward the pupil plane.

30. A microscope comprising an objective according to claim 1.

31. A microlithographic projection exposure apparatus comprising a projection objective according to claim 1.

32. Use of a projection objective according to claim 1 for microlithographic projection exposure.

33. Method of microlithographic structuring of a substrate comprising the steps of illuminating a mask with VUV light and projecting an image of said mask onto said substrate through a projection objective according to claim 1.

34. An objective according to claim 6, wherein at least one lens is arranged in the beam path between the two concave mirrors.

35. An objective according to claim 15, wherein the first refractive partial objective has a magnification ratio of −1/3 to −1/8.

36. An objective according to claim 15, wherein the second refractive partial objective has a magnification ratio of −1/0.8 to −1/2.

37. An objective according to claim 16, wherein the second refractive partial objective has a magnification ratio of −1/0.8 to −1/2.

38. An objective according to claim 19, wherein at least one of said first and second positive lens groups comprises at least four positive lenses.

39. An objective according to claim 25, wherein the at least one aspherical lens surface is on a lens of the lens group with lesser lens diameters.

40. A microlithography projection exposure apparatus comprising a projection objective according to claim 3.

41. Use of a projection objective according to claim 3 for microlithography projection exposure.

42. Method of microlithographic structuring of a substrate comprising the steps of illuminating a mask with VUV light and projecting an image of said mask onto said substrate through a projection objective according to claim 3.

43. A microlithographic projection exposure apparatus comprising a projection objective according to claim 4.

44. Use of a projection objective according to claim 4 for microlithographic projection exposure.

45. Method of microlithographic structuring of a substrate comprising the steps of illuminating a mask with VUV light and projecting an image of said mask onto said substrate through a projection objective according to claim 4.

46. A microscope comprising an objective according to claim 5.

47. A microlithographic projection exposure apparatus comprising a projection objective according to claim 5.

48. Use of a projection objective according to claim 5 for microlithographic projection exposure.

49. A catadioptric objective comprising axial symmetry and at least a first partial objective,
   an intermediate image, and
   a second partial objective,
   one of said partial objectives being purely refractive and one being purely catoptric.

50. A microscope comprising an objective according to claim 49.

51. A microlithographic projection exposure apparatus comprising a projection objective according to claim 49.

52. Use of a projection objective according to claim 49 for microlithographic projection exposure.

53. An objective comprising axial symmetry,
   an optical axis not being folded,
   at least one curved mirror and
   at least one lens and two intermediate images, and providing an image reduction.

54. An objective comprising axial symmetry,
   at least one curved mirror and
   at least one lens and two intermediate images,
   further comprising a partial objective with two opposing concave mirrors with central bores, and
   with an optical axis, said concave mirrors being arranged axially symmetric with respect to said optical axis, their concave surfaces facing each other.

55. An objective comprising axial symmetry,
   at least one curved mirror and at least one lens and two intermediate images,
   further comprising a partial objective with two opposing concave mirrors with central bores, and with an optical axis,
   said concave mirrors being arranged axially symmetric with respect to said optical axis, their concave surfaces facing each other, wherein
      a first refractive partial objective, a partial objective comprising at least one mirror, and a second refractive partial objective are arranged in sequence,
      wherein the first refractive partial objective has a magnification ratio of −1/3 to −1/8.

56. An objective comprising axial symmetry,
   at least one curved mirror and at least one lens and two intermediate images,
   further comprising a partial objective with two opposing concave mirrors with central bores, and
   with an optical axis, said concave mirrors being arranged axially symmetric with respect to said optical axis, their concave surfaces facing each other,
   wherein a first refractive partial objective, a partial objective comprising at least one mirror, and a second refractive partial objective are arranged in sequence,
   wherein at least one of the first and second refractive partial objectives consists of a first positive lens group, a negative lens group and a second positive lens group.

57. An objective comprising axial symmetry,
   at least one curved mirror and
   at least one lens and two intermediate images,
   further comprising a partial objective with two opposing concave mirrors with central bores, and with an optical axis,
   said concave mirrors being arranged axially symmetric with respect to said optical axis, their concave surfaces facing each other,
   wherein a first refractive partial objective, a partial objective comprising at least one mirror, and a second refractive partial objective are arranged in sequence,
   wherein said negative lens group comprises at least two negative menisci, their concave surfaces facing each other.

58. An objective comprising axial symmetry,
   at least one curved mirror and
   at least one lens and two intermediate images,
   wherein a first refractive partial objective, a partial objective comprising at least one mirror, and a second refractive partial objective are arranged in sequence,
   wherein at least one aspherical lens surface is on a lens of a lens group with lesser lens diameters.

59. An objective comprising axial symmetry,
   at least one curved mirror and at least one lens and two intermediate images,
   a first partial objective,
   a first intermediate image,
   a second partial objective,
   a second intermediate image,
   a third partial objective,
   wherein the third partial objective has at least one positive concave air lens near its pupil plane, located at a distance from the second intermediate image of between 25% and 75% of the length of this partial objective.

60. An objective comprising axial symmetry,
   at least one curved mirror and
   at least one lens and two intermediate images,
   a first partial objective,
   a first intermediate image,
   a second partial objective,
   a second intermediate image,
   a third partial objective,
   wherein an image side partial objective has two first lenses subsequent to the second intermediate image, which are menisci concave on the side of the intermediate image,
   and two last lenses adjacent to the image, which are meniscus concave on the side of the image.

61. An objective comprising axial symmetry,
   at least one curved mirror and
   at least one lens and two intermediate images,
   a first partial objective,
   a first intermediate image,
   a second partial objective, a second intermediate image, a third partial objective, wherein an image side partial objective has a pupil plane, and at least one lens arranged at a distance from the image plane of between 25% and 75% of the length of the image side partial objective is a meniscus concave toward the pupil plane.

62. An objective comprising axial symmetry, at least one curved mirror and at least one lens and two intermediate images, wherein at least one lens is arranged in a beam path between the two concave mirrors.

63. An objective comprising axial symmetry, at least one curved mirror and at least one lens and two intermediate images, further comprising a partial objective with two opposing concave mirrors with central bores, and with an optical axis, said concave mirrors being arranged axially symmetric with respect to said optical axis, their concave surfaces facing each other, wherein each of said concave mirrors has a vertex situated on said optical axis, and wherein each of said intermediate images has a maximum image height and is given on a surface with a piercing point on said optical axis, and at least one of said vertici is spaced from at least one of said piercing points by a distance less than the maximum image height of the image having said piercing point.

64. An objective comprising axial symmetry, at least one curved mirror and at least one lens and two intermediate images, wherein the first refractive partial objective has a magnification ratio of −1/3 to −1/8.

* * * * *